(12) United States Patent
Kwon et al.

(10) Patent No.: US 9,990,963 B2
(45) Date of Patent: Jun. 5, 2018

(54) WORD LINE VOLTAGE GENERATOR FOR MULTIPLE-TIME PROGRAMMABLE MEMORY

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Yijin Kwon, Shanghai (CN); Hao Ni, Shanghai (CN); Zijian Zhao, Shanghai (CN); Yu Cheng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days. days.

(21) Appl. No.: 15/473,226

(22) Filed: Mar. 29, 2017

(65) Prior Publication Data

US 2017/0352389 A1     Dec. 7, 2017

(30) Foreign Application Priority Data

Jun. 7, 2016   (CN) .......................... 2016 1 0398818

(51) Int. Cl.
*G11C 8/10*   (2006.01)
*G11C 5/14*   (2006.01)
*G11C 8/08*   (2006.01)
*G11C 16/08*  (2006.01)

(52) U.S. Cl.
CPC ............... *G11C 5/147* (2013.01); *G11C 8/08* (2013.01); *G11C 16/08* (2013.01)

(58) Field of Classification Search
CPC ....................................................... G11C 8/08
USPC ..................................................... 365/230.06
See application file for complete search history.

(56) References Cited

U.S. PATENT DOCUMENTS

| | | | | |
|---|---|---|---|---|
| 5,282,171 A * | 1/1994 | Tokami | ............ | G11C 8/08 365/203 |
| 6,617,907 B2 * | 9/2003 | Kamata | ............ | G11C 5/145 326/81 |
| 7,317,334 B2 * | 1/2008 | Ogane | ............ | G11C 8/08 326/81 |
| 9,496,014 B2 * | 11/2016 | Yu | ............ | G11C 8/08 |

* cited by examiner

*Primary Examiner* — Son Mai
(74) *Attorney, Agent, or Firm* — Kilpatrick Townsend and Stockton LLP

(57) ABSTRACT

A word line voltage generator circuit, a semiconductor device, and an electronic device are provided. The word line voltage generator circuit includes a switch circuit connected to a high-level signal and a low-level signal and configured to output the high-level signal or the low-level signal as a word line voltage signal based on an input signal, and a drive signal control circuit configured to provide a drive signal connected to the switch circuit in response to the input signal. A voltage rising speed of the word line voltage signal is controlled by the drive signal.

16 Claims, 5 Drawing Sheets

WORD LINE VOLTAGE GENERATOR FOR MULTIPLE-TIME PROGRAMMABLE MEMORY

CROSS-REFERENCES TO RELATED APPLICATIONS

This application claims priority to Chinese patent application No. 201610398818.2, filed on Jun. 7, 2016, the content of which is incorporated herein by reference in its entirety.

FIELD OF THE INVENTION

The present invention generally relates to semiconductor circuits. More particularly, embodiments of the present invention relate to a word line voltage generating circuit, a semiconductor device and an electronic device including the word line voltage generating circuit.

BACKGROUND OF THE INVENTION

Multiple time programmable (MTP) memories have multiple program and erase cycling capability in comparison to the one-time program (OTP) memory. MTP memories also have the advantage of data stored therein won't disappear after the power is turned off. MTP memories have been widely used in various applications and fields such as in personal computers, electronic devices, mobile storages, and the like.

A PMOS type MTP memory requires that the dedicated voltage level of word lines to reach the target voltage at a certain rate, e.g., 1V/1 us. A too slow or too fast rate of the program voltage rise may affect the program operations of the MTP memory. Current word line voltage generator circuits utilize a long-channel PMOS transistor as a current limiter to control the voltage boosting speed. A high-voltage switch is required for each current limiter to control the boosting speed. For example, five long-channel PMOS transistors are used as a current limiter, and the number of PMOS transistors is selected by switches to implement different boosting speeds. This approach requires a fixed size of the channel length, and a switch is provided for each current limiter, so that the control of the boosting speed becomes complicated. This approach cannot obtain a uniform boosting speed, and different high-voltage power supply will also affect the boost speed control. This approach may be fast in the initial stage, but becomes slow in the final stage. This approach cannot maintain a stable 1V/1 us and cannot achieve good program operations.

Thus, there is a need for an improved word line voltage generator circuit to solve the above-described problems.

BRIEF SUMMARY OF THE INVENTION

Embodiments of the present invention provide a novel word line voltage generator circuit. The word line voltage generator circuit may include a switch circuit connected to a high-level signal and a low-level signal and configured to output the high-level signal or the low-level signal as a word line voltage signal based on an input signal, and a drive signal control circuit configured to provide a drive signal connected to the switch circuit in response to the input signal. A voltage rising speed of the word line voltage signal is controlled by the drive signal.

In one embodiment, the switch circuit includes a first switch element and a second switch element connected in series between the high-level signal and the low-level signal, a word line voltage output node between the first and second switch elements and configured to receive the word line voltage signal. The first switch element is connected between the high-level signal and the word line voltage output node, and the second switch element is connected between the low-level signal and the word line voltage output node.

In one embodiment, the drive signal includes a first drive signal connected to the first switch element and a second drive signal connected to the second switch element. When one of the first and second switch elements is turned on, the other one is turned off.

In one embodiment, the first drive signal turns on the first switch element when the input signal is at a high level, and the second drive signal turns on the second switch element when the input signal is at a low level.

In one embodiment, the first switch element is a PMOS transistor, and the second switch element is an NMOS transistor.

In one embodiment, the first drive signal has a voltage in a range between 0.3 V and 0.8 V when the input signal is at the high level.

In one embodiment, the voltage rising speed of the word line voltage is related to a magnitude of the first drive signal when the first switch element is turned on.

In one embodiment, the word line voltage generator circuit further includes a bias signal generator circuit configured to generate a bias signal, wherein the first drive signal is generated based on the bias signal when the input signal is at the high level.

In one embodiment, the bias signal generator circuit includes an internal bias signal generator circuit configured to generate an internal bias signal, an external bias signal generator circuit configured to generate an external bias signal, and a bias voltage signal selection circuit configured to select one of the internal bias signal and the external bias signal as the bias signal.

In one embodiment, the bias signal has a voltage in a range between 0.3 V and 1.0 V.

Embodiments of the present invention also provide a semiconductor device including a word line voltage generator circuit and a memory cell connected to the word line voltage generator circuit. The word line voltage generator circuit includes a switch circuit coupled to a high-level signal and a low-level signal and configured to output the high-level signal or the low-level signal as a word line voltage signal based on an input signal, and a drive signal control circuit configured to provide a drive signal connected to the switch circuit in response to the input signal. The voltage rising speed of the word line voltage signal is controlled by the drive signal.

Embodiments of the present invention also provide an electronic device including a semiconductor device and an electronic component connected to the semiconductor device. The semiconductor device includes a word line voltage generator circuit and a memory cell connected to the word line voltage generator circuit. The word line voltage generator circuit includes a switch circuit coupled to a high-level signal and a low-level signal and configured to output the high-level signal or the low-level signal as a word line voltage signal based on an input signal, and a drive signal control circuit configured to provide a drive signal connected to the switch circuit in response to the input signal, wherein a voltage rising speed of the word line voltage signal is controlled by the drive signal.

The following description, together with the accompanying drawings, will provide a better understanding of the nature and advantages of the claimed invention.

DETAILED DESCRIPTION OF THE INVENTION

Figure 1:
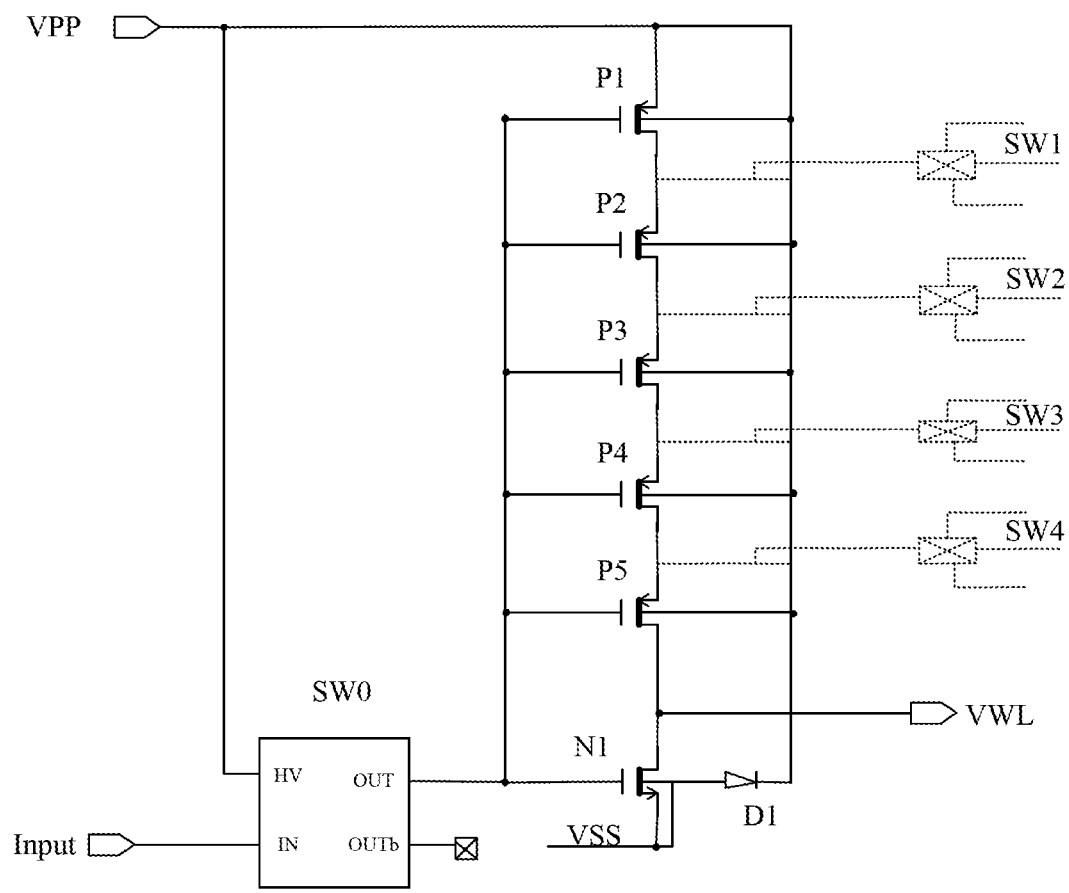
FIG. 1 is a schematic circuit diagram of a conventional word line voltage generator circuit, as known in the art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

As used herein, the terms "a", "an" and "the" may include singular and plural references. It will be further understood that the terms "comprising", "including" having", "containing" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

It will be understood that, when an element is referred to as "adjacent to," "connected to," or "coupled to" another element, it can be disposed adjacent to, connected or coupled to the other element, or intervening elements may also be present. In contrast, when an element is referred to as being "directly connected to," or "directly coupled to" another element, there are no intervening elements present between them. It will be understood that, although the terms "first," "second," "third," etc. may be used herein to describe various elements, components, regions, and/or sections, these elements, components, regions, and/or sections should not be limited by these terms. These terms are only used to distinguish one element, component, region, or section from another region, or section. Thus, a first element, component, region, or section discussed below could be termed a second element, component, region, or section without departing from the teachings of the present invention.

As used herein, the terms "low", "logic low", "low level", and "low logic level" may be used interchangeably. The terms "high", "logic high", "high level", and "high logic level" may be used interchangeably. The terms "signal" and "signal pin" may be used interchangeably. Furthermore, as used herein, the term "if" may also mean "when" or "upon", depending on the context. Furthermore, as used herein, the words "and/or" may refer to and encompass any possible combinations of one or more of the associated listed items.

FIG. 1 is a schematic circuit diagram of a conventional word line voltage generator circuit, as known in the art. As shown in FIG. 1, the word line voltage generator circuit includes five PMOS transistors P1, P2, P3, P4, P5 and an NMOS transistor N1 that are connected in series between a high-voltage power supply VPP (e.g., a voltage of about 7 V) and a ground terminal VSS, and a high-voltage switch SW0. The high-voltage switch SW0 includes a first input terminal connected to the high-voltage power supply VPP, a second input terminal connected to an input signal Input, a first output terminal OUT connected to a gate terminal of the PMOS transistors P1, P2, P3, P4, P5 and the NMOS transistor N1. When the input signal Input is high, the first output terminal OUT of SW0 is low, the PMOS transistors P1, P2, P3, P4, and P5 are turned on, the NMOS transistor N1 is turned off, the word line level (VWL) outputs VPP. The PMOS transistors P1, P2, P3, P4, and P5 are long-channel transistors operating as current limiters. The number of PMOS transistors is selected by switches SW1 to SW4 in order to implement different voltage boosting speeds. This approach requires a fixed-length channel, and a switch is provided for each current limiter so that the control of the boosting speed becomes complicated. As shown in the simulation results in FIG. 5, this approach cannot achieve a uniform boosting speed. The voltage boosting step is fast at the initial stage and slow at the final stage, and cannot maintain at 1V/1 us. In addition, a change in the voltage level of the high-voltage power supply VPP affects the voltage boosting speed that cannot be well controlled. Thus, this approach does not provide good program operations for the MTP memory.

Figure 2:
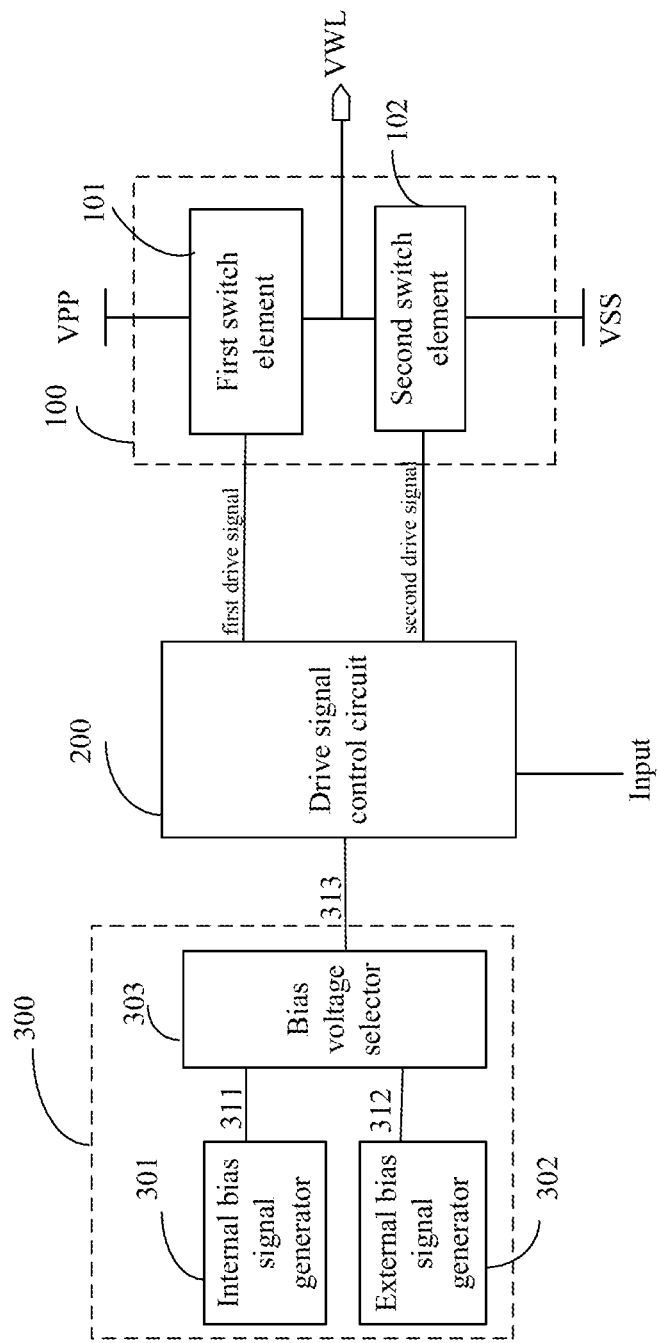
FIG. 2 is a simplified block diagram of a word line voltage generator circuit according to an embodiment of the present invention.

Embodiments of the present invention provide an improved word line voltage generator circuit that can solve the above-described problems associated with the word line voltage generator circuit of FIG. 1. FIG. 2 is a simplified block diagram of a word line voltage generation circuit according to an embodiment of the present invention. As shown in FIG. 2, the word line voltage generation circuit may include a switch circuit 100, a drive signal control circuit 200, and a bias voltage control circuit 300.

Switch circuit 100 is connected to a high-voltage level signal VPP and a low-level voltage signal VSS and configured to output either the high-voltage signal VPP or the low-level signal VSS as a word line voltage in response to an input signal. Specifically, switch circuit 100 includes a first switch element 101 and a second switch element 102 connected in series between the high-level voltage signal VPP and the low-level voltage signal VSS, a word line voltage output node VWL between first switch element 101 and second switch element 102. First switch element 101 is connected between the high-level voltage signal VPP and the word line voltage output node VWL. Second switch element 102 is disposed between the low-level voltage signal VSS and the word line voltage output node VWL.

Drive signal control circuit 200 provides a drive signal to switch circuit 100 in response to an input signal Input so that switch circuit 100 operates under the control of the drive signal to pass the high-level voltage signal VPP or the low-level voltage signal VSS. When switch circuit 100 passes the high-level signal VPP, the drive signal controls the rate of the voltage rising speed of the word line. Specifically, drive signal control circuit 200 is configured to provide a first drive signal to first switch element 101 and a second drive signal to second switch element 102 in response to the input signal Input, so that one of the first and second switch elements 101 and 102 is turned on and the other one is turned off. It is noted that both first and second switch elements cannot be turned on at the same time under any circumstances.

Further, drive signal control circuit 200 is configured to provide the first drive as a turn-on signal to turn on the first switch element when the input signal Input is at a high level; and drive signal control circuit 200 is configured to provide the second drive signal as a turn-on signal to turn on the second switch element when the input signal Input is at a low level. The rising speed of the voltage at the word line voltage output node VWL is a function of the magnitude of the first drive signal. In other words, the voltage rising speed of the word line voltage at the output node VWL is related to or associated with the voltage level of the first drive signal when the first switch element is turned on.

Moreover, the word line voltage generator circuit of the present invention also includes a bias signal generator circuit 300 configured to generate a bias signal. The first drive signal is generated based on the bias signal when the input signal is at a high level.

Specifically, bias signal generator circuit 300 includes an internal bias signal generator circuit 301 configured to generate an internal bias signal 311, and an external bias signal generator circuit 302 configured to generate an external bias signal 312, and a bias signal selection circuit 303 configured to select one of internal bias signal 311 and external bias signal 312 to be the bias signal 313 at its output.

In accordance with the present invention, the word line voltage generator circuit controls the rising rate of the word line voltage through the magnitude (voltage level) of the drive signal so that not only good programming operation performance can be achieved, but also a fixed size of the transistors is not required.

For a thorough understanding of the present invention, the detailed description of the word line voltage generator circuit and the operation steps will be provided below. A preferred embodiment of the present invention will be described below, however, other embodiments are also possible.

First Embodiment

Figure 3:
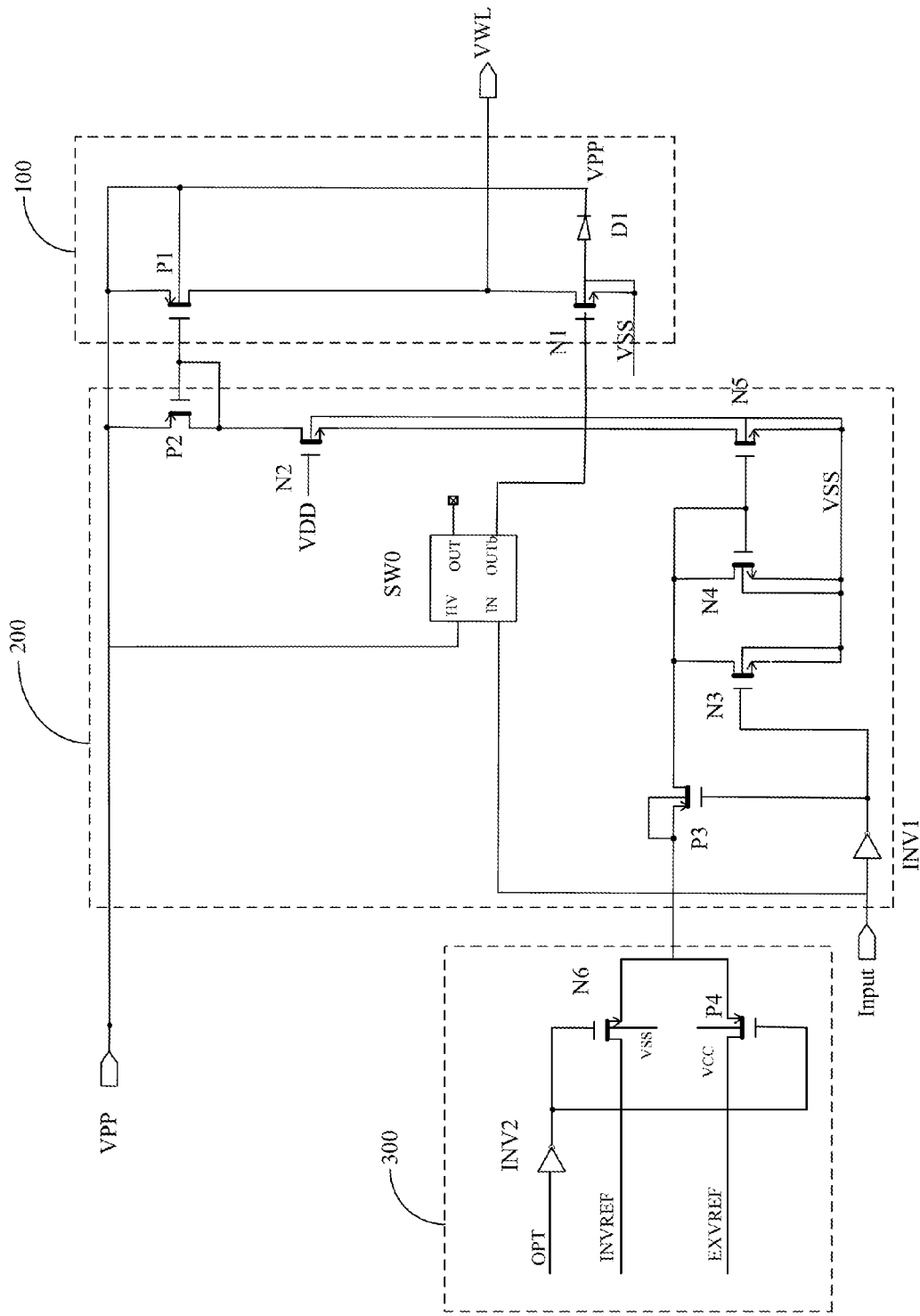
FIG. 3 is a schematic circuit diagram of a word line voltage generator circuit according to an embodiment of the present invention.
Figure 4:
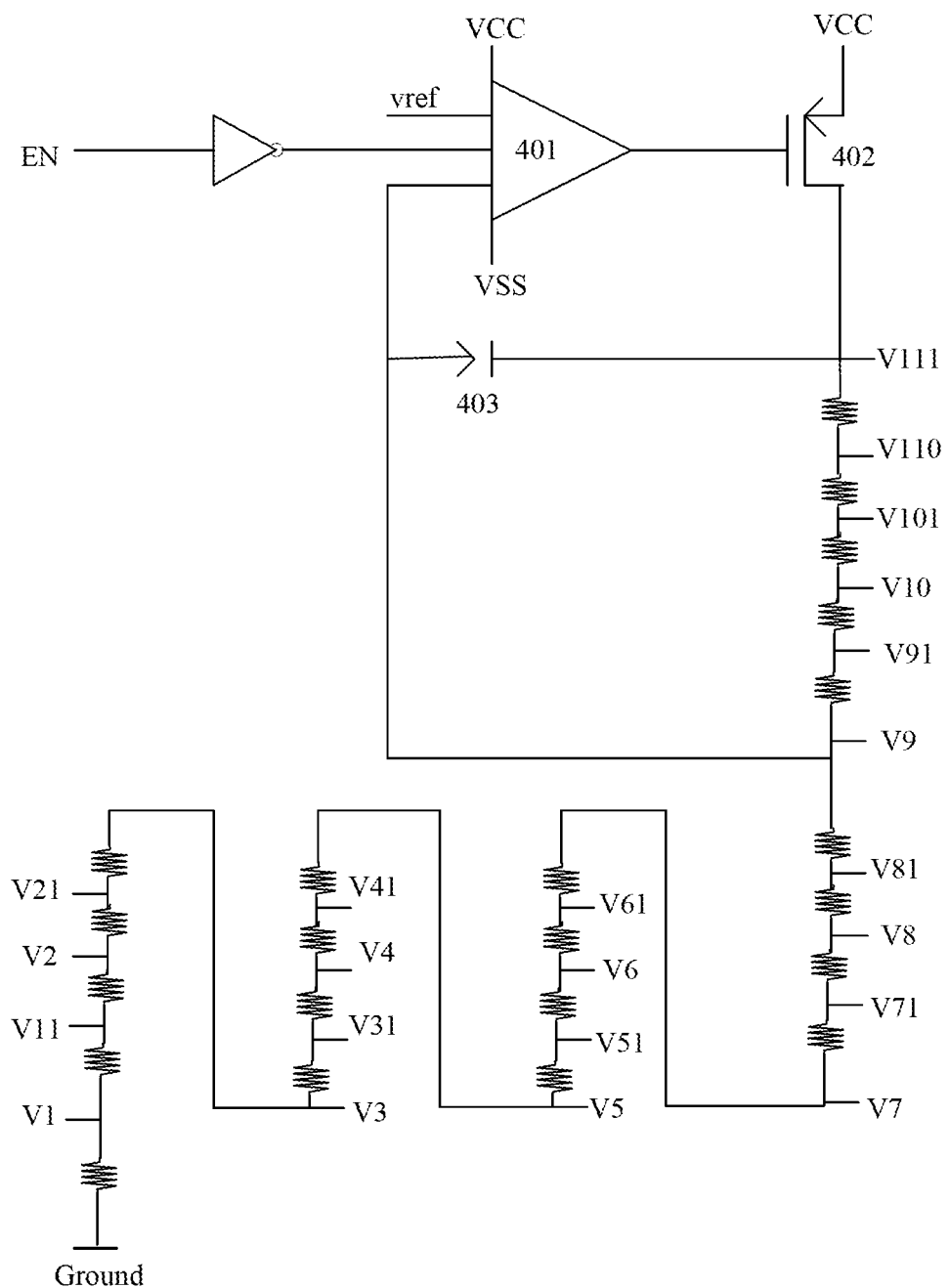
FIG. 4 is a schematic circuit diagram of an internal bias voltage generator circuit according to an embodiment of the present invention.

FIG. 3 is a schematic circuit diagram of a word line voltage generator circuit according to an embodiment of the present invention. FIG. 4 is a schematic circuit diagram of an internal bias voltage generator circuit according to an embodiment of the present invention. The word line voltage generator circuit of the present invention will now be described in detail with reference to FIGS. 3 and 4.

Referring to FIG. 3, the word line voltage generator circuit according to an embodiment of the present invention includes a switch circuit 100, a drive signal control circuit 200, and a bias signal generator circuit 300.

Switch circuit 100 includes a first switch transistor P1 and a second switch transistor N1. P1 is a PMOS transistor having a source terminal connected to a high-voltage signal VPP (e.g., 6 to 7 V), a drain terminal connected to a word line voltage output node VWL, and a gate terminal connected to a first drive signal. N1 is an NMOS transistor having a drain terminal connected to the word line voltage output node VWL, a source terminal connected to a low-level signal VSS (e.g., a ground terminal GND), and a gate terminal connected to a second drive signal. The first switch transistor P1 and the second switch transistor N1 are turned on and turned off by the first drive signal and the second drive signal, respectively. One of the first switch transistor P1 and the second switch transistor N1 is turned on while the other transistor is turned off. In the embodiment, when the input signal Input is at a high level, the first switch transistor P1 is turned on and connects the word line voltage output node VWL to the high-voltage signal VPP. When the input signal Input is at a low level, the second switch transistor N1 is turned on and connects the word line voltage output node VWL to the low-level signal VSS, e.g., 0 V.

Drive signal control circuit 200 controls the first drive signal and the second drive signal to turn on and turn off the first switch transistor P1 and the second switch transistor N1, respectively. Drive signal control circuit 200 controls the turn-on speed of the first switch transistor P1 and thus the rising speed of the word line voltage by controlling the magnitude (voltage level) of the first drive signal.

Referring to FIG. 3, in the embodiment, drive signal control circuit 200 includes PMOS transistors P2, P3, NMOS transistors N2, N3, N4, N5, a high-voltage switch SW0, and an inverter INV1. The inverter INV1 has an input terminal connected to the input signal Input and an output terminal connected to the gate terminal of transistors N3 and P3 for turning on and off the transistors N3 and P3. The transistor P3 has a source terminal connected the output of the bias signal generator circuit, and a drain terminal connected to the drain terminal of the transistor N3 and N4. The transistors N3, N4, and N5 each have a source terminal connected to VSS (ground). The transistor N4 has the drain terminal and the gate terminal connected together and connected to the gate terminal of the transistor N5. The transistor N5 has a drain terminal connected to a source terminal of the transistor N2. The transistor N2 has a gate terminal connected to a power supply VDD, a drain terminal connected to a drain terminal of the transistor P2. The transistor P2 has a source terminal connected to the high-voltage signal VPP, a gate terminal connected to the drain terminal for outputting the first drive signal. In an embodiment, the transistors N2, N3, N4, and N5 each have the substrate connected to VSS (ground). In an embodiment, the transistor P3 has its substrate connected to the source terminal.

The high-voltage switch SW0 has a first input terminal connected to the high-voltage signal VPP, a second input terminal connected to the input signal Input, a first output terminal not connected to any circuitry, and a second output terminal for outputting the second drive signal. The high-voltage switch SW0 operates in the following manner: when the input signal Input is low, P3 is off, N3 is on, the gate of N4 and N5 is 0 V (VSS), so N4 and N5 are off. The transistors P1 and P2 are off, the output OUTb of the switch SW0 is low, and VWL is at 0 V. When the input signal Input is high, P3 is on, N3 is off, the gate of N4 and N5 is at the reference bias level, so that N4 and N5 are on, P1 and P2 are on, the output OUTb of the switch SW0 is low, and VWL rises slowly from 0 V to VPP.

In other words, in the embodiment, when the input signal Input is at the high level, the second drive signal is at the low level, the transistor N2 is turned off. The input signal Input changes to a low level through the inverter INV1 to turn on the transistor P3 and turn off the transistor N3. At this time, the voltage at the drain terminal of the transistors N4, N5 is the bias voltage signal generated by bias signal generator circuit 300, e.g., 0.3 3 to 1.0 V, which causes the transistors N4, N5 to operate in saturation and form a current mirror structure. The transistor P2 conducts current at a saturated condition and outputs the first drive signal in the range between 0.3 V and 0.8 V, so that the first switch transistor P1 is turned on and the current flowing through the switch transistor P1 is a function of the magnitude (voltage level) of the first drive signal. The rising speed of the word line voltage VWL can be controlled by controlling the magnitude of the first drive signal, for example, to provide the rising speed at a constant rate of 1V/1 us to output the VPP voltage, thereby achieving an improved program operation performance.

When the input signal Input is at the low level, the high-voltage switch SW0 output a high-level signal, the second switch transistor N1 is turned on, the word line voltage output node VWL is at the low level, e.g., 0V. At the same time, the input signal Input transits into the high level through the inverter INV1 to turn off the transistor P3 and to cut off the bias signal input. The transistor N3 is turned on, the gate terminal of the transistors N4 and N5 is at the low level to turn off the transistors N4 and N5, the signal level of the first drive signal at the gate terminal of the transistors P1 and P2 is greater than 1 V so that the transistors P1 and P2 are turned off.

Bias signal generator circuit 300 is configured to output a variable bias signal, e.g., a bias signal of 0.3 V to 1.0 V, to generate a predetermined voltage range of the first drive signal to control the rise speed of the word line voltage. In the embodiment, bias signal generator circuit 300 includes an internal bias signal generator circuit INVREF for generating an internal bias signal and an external signal generator circuit EXVREF for generating an external bias signal, and a bias signal selector circuit for selecting the internal bias signal and the external bias signal. In the embodiment, bias signal generator circuit 300 also includes an inverter INV2, a switch transistor N6, a switch transistor P4. The inverter INV2 has an input terminal connected to a selection signal OPT, and an output terminal connected to the gate terminal of switch transistor N6 and P4. Switch transistor N6 has a drain terminal connected to the internal bias signal generator circuit INVREF, and a source terminal connected to the output terminal of bias signal generator circuit 300. Switch transistor P4 has a drain terminal connected to the external bias signal generator circuit EXVREF, and a source terminal connected to the output terminal of bias signal generator circuit 300. The turn-on and turn-off of the switch transistors N6 and P4 are controlled by the selection signal OPT so as to select whether to output the internal bias signal or the external bias signal.

The internal bias signal generator circuit INVREF and the external signal generator circuit EXVREF can be selected in accordance with the requirement of various suitable circuits. FIG. 4 is a schematic circuit diagram of an internal bias voltage generator circuit according to an embodiment of the present invention. The components 401, 402, 403 and the feedback loop including a number of resistors form a current source. In an embodiment, the reference voltage Vref may be 1.2 V, the supply voltage Vcc may be 1.5 V±10%. The internal bias voltage generator circuit supplies internally generated voltages V1, V11, V2, V21, etc. as a desired target bias voltage for the word line voltage generator circuit. The internally generated voltages V1, V11, V2, V21, . . . , V110, V111. may have any level of granularity. In an illustrative example, each voltage divider may generate a bias voltage of 0.05 V, i.e., V1 may be 0.2V, V11 may be 0.25V, V2 may be 0.3V, V21 may be 0.35 V, . . . , V110 may be 1.15 V, and V111 may be 1.2 V. In an exemplary embodiment, the internal bias voltage generator circuit INVREF can output an internal bias signal in the range between 0.2 V and 1.2 V. The external reference voltage EXVREF is generated externally and provided to the switch circuit through the drive signal control circuit.

Figure 5:
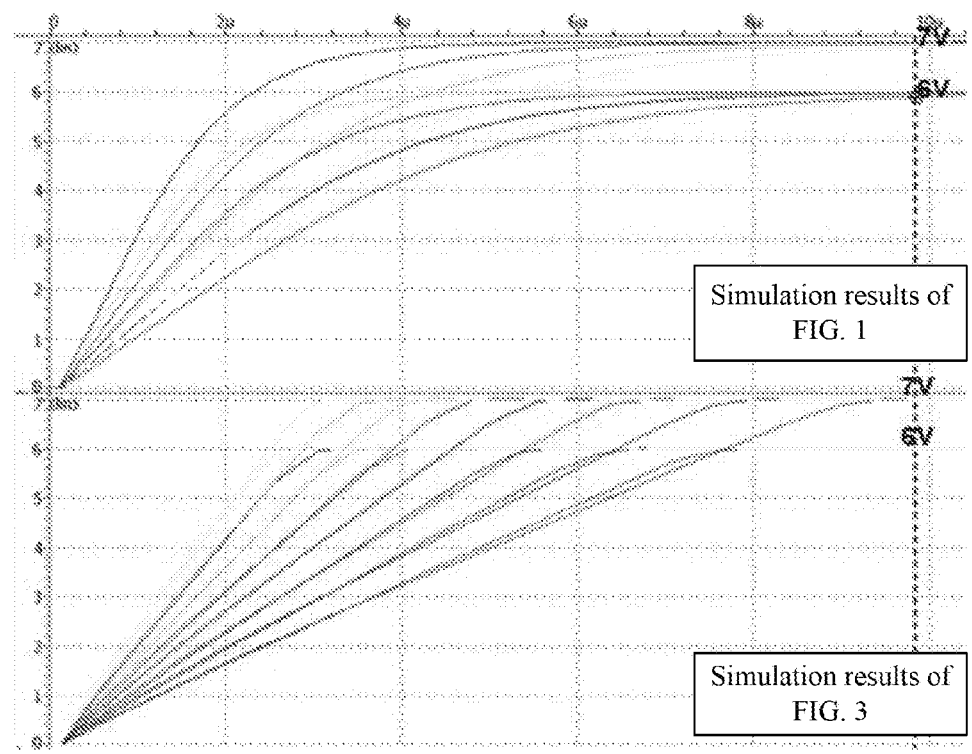
FIG. 5 is a set of graphs illustrating simulated results of the word line voltage generator circuit of FIG. 1 and the word line voltage generator circuit of FIG. 3.

The word line voltage generator circuit of the embodiment controls the rising speed of the word line voltage by controlling the magnitude of the drive signal so that the rising speed is constant for a better program operation performance. FIG. 5 is a set of graphs illustrating simulated results of the word line voltage generator circuit of FIG. 1 and the word line voltage generator circuit of FIG. 3. As shown in FIG. 5, the rising speed of the word line voltage is uniform throughout the duration of the word line voltage rise, for example, from the initial stage to the final stage, and the rising speed of the voltage can be controlled by controlling the magnitude of the drive signal. Moreover, when the level of the high-voltage signal VPP changes, for example, from 6 V to 7 V, the word line voltage generator circuit of the embodiment is capable of increasing the word line voltage during the entire stage of the rise of the word line voltage, for example, the rising speed is the same at the initial stage and at the final stage to obtain a good control of the word line voltage. In comparison, the rising speed of the word line voltage generator circuit of FIG. 1 is fast at the initial stage and slow at the final stage, as shown in the upper portion of FIG. 5.

Second Embodiment

Embodiments of the present invention also provide a semiconductor device including a word line voltage generator circuit and a memory cell connected to the word line voltage generator circuit. Illustratively, in an embodiment, the memory cell is a PMOS type multiple time programmable (MTP) memory.

The word line voltage generator circuit includes a switch circuit configured to output a high-level signal or a low-level signal to the word line voltage node VWL in response to an input drive signal, a drive signal control circuit configured to control a drive signal provided to the switch circuit in response to the input signal. The switch circuit passes a high-voltage signal or a low-level signal to the word line voltage node in responsive to the drive signal. When the switch circuit passes the high-voltage signal, the rise speed of the high-voltage signal at the word line voltage node is controlled by the magnitude of the drive signal.

The semiconductor device of the present invention can have improved program operation performance by controlling the rise speed of the word line voltage through the magnitude of the drive signal.

Third Embodiment

Embodiments of the present invention also provide an electronic device that includes a semiconductor device and an electronic component connected to the semiconductor device. The semiconductor device includes a word line voltage generator circuit and a memory cell connected to the word line voltage generator circuit. In an exemplary embodiment, the memory cell is a PMOS type multiple time programmable (MTP) memory.

The word line voltage generator circuit includes a switch circuit configured to output a high-level signal or a low-level signal to the word line voltage node VWL in response to an input drive signal, a drive signal control circuit configured to control a drive signal provided to the switch circuit in response to the input signal. The switch circuit passes a high-voltage signal or a low-level signal to the word line voltage node in responsive to the drive signal. When the switch circuit passes the high-voltage signal, the rise speed of the high-voltage signal at the word line voltage node is controlled by the magnitude of the drive signal.

The electronic component may be any electronic component, such as a discrete device, an integrated circuit, or the like.

In an embodiment, the electronic device may be any electronic device such as a mobile phone, a tablet computer, a notebook computer, a netbook, a game machine, a television set, a VCD, a DVD, a GPS device, a digital camera, a digital video recorder, a digital voice recorder, a MP3 palyer, a MP4 player, and any intermediate product including the semiconductor device.

Figure 6:
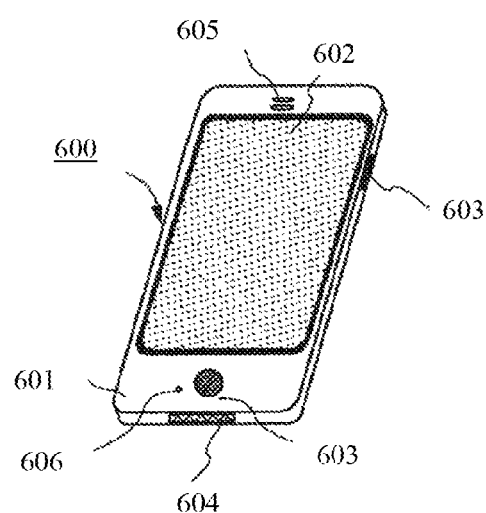
FIG. 6 is a schematic configuration of an electronic device according to an embodiment of the present invention.

FIG. 6 is a schematic configuration of an electronic device 600 according to an embodiment of the present invention. Electronic device 600 includes a housing 601 including a display portion 602, an operation button 603, an external connection port 604, a speaker 605, a microphone 606, etc.

The electronic device of the embodiment has a similar advantage since it includes a semiconductor device capable of controlling the rise spped of the word line voltage of a multiple time programmable (MTP) memory.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A word line voltage generator circuit, comprising:
   a switch circuit coupled to a high-level signal and a low-level signal and configured to output the high-level signal or the low-level signal as a word line voltage signal based on an input signal, the switch circuit comprising a first switch element and a second switch element connected in series between the high-level signal and the low-level signal, and a word line voltage output node between the first and second switch elements and configured to receive the word line voltage signal, the first switch element being connected between the high-level signal and the word line voltage output node, and the second switch element being connected between the low-level signal and the word line voltage output node; and
   a drive signal control circuit configured to provide a drive signal connected to the switch circuit in response to the input signal, the drive signal comprising a first drive signal connected to the first switch element and a second drive signal connected to the second switch element,
   wherein when one of the first and second switch elements is turned on, the other one is turned off,
   wherein the first drive signal turns on the first switch element when the input signal is at a high level, and the second drive signal turns on the second switch element when the input signal is at a low level,
   wherein the first drive signal has a voltage in a range between 0.3 V and 0.8 V when the input signal is at the high level, and
   wherein a voltage rising speed of the word line voltage signal is controlled by the drive signal.

2. The word line voltage generator circuit of claim 1, wherein the first switch element is a PMOS transistor, and the second switch element is an NMOS transistor.

3. The word line voltage generator circuit of claim 1, wherein the voltage rising speed of the word line voltage is related to a magnitude of the first drive signal when the first switch element is turned on.

4. A word line voltage generator circuit, comprising:
   a switch circuit coupled to a high-level signal and a low-level signal and configured to output the high-level signal or the low-level signal as a word line voltage signal based on an input signal, the switch circuit comprising a first switch element and a second switch element connected in series between the high-level signal and the low-level signal, and a word line voltage output node between the first and second switch elements and configured to receive the word line voltage signal, the first switch element being connected between the high-level signal and the word line voltage output node, and the second switch element being connected between the low-level signal and the word line voltage output node; and
   a drive signal control circuit configured to provide a drive signal connected to the switch circuit in response to the input signal, the drive signal comprising a first drive signal connected to the first switch element and a second drive signal connected to the second switch element;
   a bias signal generator circuit configured to generate a bias signal,
   wherein when one of the first and second switch elements is turned on, the other one is turned off,
   wherein the first drive signal turns on the first switch element when the input signal is at a high level, and the second drive signal turns on the second switch element when the input signal is at a low level,
   wherein the first drive signal is generated based on the bias signal when the input signal is at the high level, and
   wherein a voltage rising speed of the word line voltage signal is controlled by the drive signal.

5. The word line voltage generator circuit of claim 4, wherein the bias signal generator circuit comprises:
   an internal bias signal generator circuit configured to generate an internal bias signal;

an external bias signal generator circuit configured to generate an external bias signal; and a bias voltage signal selection circuit configured to select one of the internal bias signal and the external bias signal as the bias signal.

6. The word line voltage generator circuit of claim 4, wherein the bias signal has a voltage in a range between 0.3 V and 1.0 V.

7. A semiconductor device including a word line voltage generator circuit and a memory cell connected to the word line voltage generator circuit, wherein the word line voltage generator circuit comprises:

a switch circuit coupled to a high-level signal and a low-level signal and configured to output the high-level signal or the low-level signal as a word line voltage signal based on an input signal, the switch circuit comprising a first switch element and a second switch element connected in series between the high-level signal and the low-level signal, and a word line voltage output node between the first and second switch elements and configured to receive the word line voltage signal, the first switch element being connected between the high-level signal and the word line voltage output node, and the second switch element being connected between the low-level signal and the word line voltage output node; and a drive signal control circuit configured to provide a drive signal connected to the switch circuit in response to the input signal, the drive signal comprising a first drive signal connected to the first switch element and a second drive signal connected to the second switch element and a bias signal generator circuit configured to generate a bias signal, wherein when one of the first and second switch elements is turned on, the other one is turned off, wherein the first drive signal turns on the first switch element when the input signal is at a high level, and the second drive signal turns on the second switch element when the input signal is at a low level, wherein the first drive signal is generated based on the bias signal when the input signal is at the high level, and wherein a voltage rising speed of the word line voltage signal is controlled by the drive signal.

8. The word line voltage generator circuit of claim 4, wherein the internal bias signal generator is configured to generate the internal bias signal in a range between 0.2 V and 1.2 V.

9. The word line voltage generator circuit of claim 4, wherein the internal bias signal generator is configured to generate the internal bias signal with a 0.05 V granularity.

10. The word line voltage generator circuit of claim 4, wherein the voltage rising speed of the word line voltage signal at an initial stage and the voltage rising speed of the word line voltage signal at a final stage are the same.

11. The word line voltage generator circuit of claim 4, wherein the voltage rising speed of the word line voltage signal is controlled by a magnitude of the drive signal.

12. The word line voltage generator circuit of claim 4, wherein the bias voltage signal selection circuit comprises:

a selection input terminal configured to receive a selection signal;

an inverter coupled to the selection input terminal and configured to provide an inverted selection signal;

a first switch having a drain terminal connected to the internal bias signal, a source terminal connected to an input terminal of the drive signal control circuit, and a gate connected to the inverted selection signal;

a second switch having a drain terminal connected to the external bias signal, a source terminal connected to the input terminal of the drive signal control circuit, and a gate connected to the selection signal.

13. The semiconductor device of claim 7, wherein the bias signal generator circuit comprises:

an internal bias signal generator circuit configured to generate an internal bias signal;

an external bias signal generator circuit configured to generate an external bias signal; and a bias voltage signal selection circuit configured to select one of the internal bias signal and the external bias signal as the bias signal.

14. The semiconductor device of claim 7, wherein the bias voltage signal selection circuit comprises:

a selection input terminal configured to receive a selection signal;

an inverter coupled to the selection input terminal and configured to provide an inverted selection signal;

a first switch having a drain terminal connected to the internal bias signal, a source terminal connected to an input terminal of the drive signal control circuit, and a gate connected to the inverted selection signal;

a second switch having a drain terminal connected to the external bias signal, a source terminal connected to the input terminal of the drive signal control circuit, and a gate connected to the selection signal.

15. The semiconductor device of claim 7, wherein the voltage rising speed of the word line voltage signal is controlled by a magnitude of the drive signal.

16. The semiconductor device of claim 7, wherein the voltage rising speed of the word line voltage signal at an initial stage and the voltage rising speed of the word line voltage signal at a final stage are the same.

* * * * *